United States Patent
Hashimoto et al.

(10) Patent No.: US 8,633,514 B2
(45) Date of Patent: *Jan. 21, 2014

(54) GROUP III NITRIDE SEMICONDUCTOR WAFER AND GROUP III NITRIDE SEMICONDUCTOR DEVICE

(75) Inventors: Shin Hashimoto, Itami (JP); Tatsuya Tanabe, Itami (JP); Katsushi Akita, Itami (JP); Hideaki Nakahata, Itami (JP); Hiroshi Amano, Nagoya (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/409,798

(22) Filed: Mar. 1, 2012

(65) Prior Publication Data
US 2012/0161205 A1 Jun. 28, 2012

Related U.S. Application Data

(63) Continuation of application No. 12/732,775, filed on Mar. 26, 2010, now Pat. No. 8,148,751.

(30) Foreign Application Priority Data

Aug. 28, 2009 (JP) .............................. P2009-198701

(51) Int. Cl.
*H01L 29/66* (2006.01)
(52) U.S. Cl.
USPC .................................. 257/192; 257/E29.081
(58) Field of Classification Search
None
See application file for complete search history.

(56) References Cited

U.S. PATENT DOCUMENTS

| | | | |
|---|---|---|---|
| 6,064,082 A | 5/2000 | Kawai et al. | |
| 8,148,751 B2 * | 4/2012 | Hashimoto et al. | 257/192 |

FOREIGN PATENT DOCUMENTS

| | | |
|---|---|---|
| JP | 11-103134 | 4/1999 |
| JP | 2005-167275 A | 6/2005 |
| JP | 2005-203418 | 7/2005 |
| JP | 2006-032911 | 2/2006 |
| JP | 2006-093400 | 4/2006 |

(Continued)

OTHER PUBLICATIONS

Raman et al:, "AlGaN Channel High Electron Mobility Transistors: Device Performance and Power-Switching Figure of Merit" Japanese Journal of Applied Physics, vol. 47, No. 5, pp. 3359-3361 (2008).
Nanjo et al.: "Remarkable breakdown voltage enhancement in AlGaN channel high electron mobility transistors", Applied Physics Letters 92, 263502 (2008).

(Continued)

*Primary Examiner* — Michael Lebentritt
*Assistant Examiner* — Kevin Quinto
(74) *Attorney, Agent, or Firm* — Venable LLP; Michael A. Sartori; Tamatane J. Aga

(57) ABSTRACT

A group III nitride semiconductor device and a group III nitride semiconductor wafer are provided. The group III nitride semiconductor device has a channel layer comprising group III nitride-based semiconductor containing Al. The group III nitride semiconductor device can enhance the mobility of the two-dimensional electron gas and improve current characteristics. The group III nitride semiconductor wafer is used to make the group III nitride semiconductor device. The group III nitride semiconductor wafer comprises a substrate made of $Al_XGa_{1-X}N$ ($0<X\leq1$), a first AlGaN layer made of group III nitride-based semiconductor containing Al and disposed on the substrate, and a second AlGaN layer made of group III nitride-based semiconductor having a bandgap greater than the first AlGaN layer and disposed thereon. The full width at half maximum values of X-ray rocking curves for (0002) and (10-12) planes of the first AlGaN layer are less than 1000 arcseconds.

24 Claims, 13 Drawing Sheets

(56) References Cited

FOREIGN PATENT DOCUMENTS

| JP | 2007-067240 A | 3/2007 |
|----|---------------|--------|
| JP | 2007-073975   | 3/2007 |
| JP | 2007-258230 A | 10/2007 |
| JP | 2008-115023   | 5/2008 |
| JP | 2008-243881   | 10/2008 |

OTHER PUBLICATIONS

Hashimoto et al.: "The effects of crystalline quality to 2-dimension electron gas in AlGaN channel HEMTs", The Japan Society of Applied Physics and Related Societies, No. 3, Extended Abstracts (The 56th Spring Meeting, 2009), p. 1458, (Mar. 30, 2009).

Notice of Reasons for Rejection in Japanese Patent Application No. 2011-274672, dated Feb. 26, 2013.

* cited by examiner

Fig.3

| Sample No. | Substrate | AlN layer thickness (nm) | FWHM value of X-ray rocking curve (arcsec) | | | | Sheet resistance (Ω/□) |
|---|---|---|---|---|---|---|---|
| | | | AlN layer (0002)plane | AlN layer (10$\bar{1}$2)plane | AlGaN layer (0002)plane | AlGaN layer (10$\bar{1}$2)plane | |
| A1 | sapphire | 80 | 209 | not measurable | 796 | 1323 | 10066 |
| A2 | sapphire | 140 | 384 | 1066 | 911 | 1522 | 58302 |
| A3 | sapphire | 200 | 809 | not measurable | 803 | 5600 | 440710 |
| A4 | sapphire | 900 | 447 | 923 | 514 | 693 | 3525 |
| A5 | sapphire | 600 | 784 | 1041 | 709 | 970 | 4120 |
| A6 | sapphire | 2000 | 412 | 638 | 420 | 610 | 3210 |

Fig.4

| Sample No. | Substrate | AlN layer thickness (nm) | FWHM value of X-ray rocking curve (arcsec) | | | | Sheet resistance (Ω/□) |
|---|---|---|---|---|---|---|---|
| | | | AlN layer (0002)plane | AlN layer (10$\bar{1}$2)plane | AlGaN layer (0002)plane | AlGaN layer (10$\bar{1}$2)plane | |
| B1 | sapphire | 80 | 463 | not measurable | 811 | 1545 | 6232 |
| B2 | sapphire | 150 | 1447 | not measurable | 1082 | 3560 | 19822 |
| B3 | sapphire | 900 | 449 | 742 | 513 | 711 | 2754 |
| B4 | sapphire | 600 | 671 | 992 | 680 | 980 | 3051 |

Fig.7

| Sample No. | Substrate | AlN layer thickness (nm) | FWHM value of X-ray rocking curve (arcsec) | | | | Sheet resistance (Ω/□) |
|---|---|---|---|---|---|---|---|
| | | | AlN layer (0002)plane | AlN layer (10$\bar{1}$2)plane | AlGaN layer (0002)plane | AlGaN layer (10$\bar{1}$2)plane | |
| C1 | AlN substrate | 800 | 47 | 67 | 177 | 326 | 2471 |
| C2 | AlN substrate | 800 | 65 | 92 | 195 | 396 | 2660 |

Fig.8

| Sample No. | Substrate | AlN layer thickness (nm) | FWHM value of X-ray rocking curve (arcsec) ||||Sheet resistance (Ω/□) |
| | | | AlN layer (0002)plane | AlN layer (10$\bar{1}$2)plane | AlGaN layer (0002)plane | AlGaN layer (10$\bar{1}$2)plane | |
|---|---|---|---|---|---|---|---|
| D1 | AlGaN substrate | — | — | — | 84 | 161 | 2032 |

Fig.11

| Sample No. | Substrate | FWHM value of X-ray rocking curve (arcsec) | | Sheet resistance ($\Omega/\square$) |
|---|---|---|---|---|
| | | GaN layer (0002)plane | GaN layer (10$\bar{1}$2)plane | |
| E1 | sapphire | 282 | 467 | 409 |
| E2 | sapphire | 276 | 724 | 479 |
| E3 | Si | 626 | 1783 | 605 |

GROUP III NITRIDE SEMICONDUCTOR WAFER AND GROUP III NITRIDE SEMICONDUCTOR DEVICE

CROSS-REFERENCE TO RELATED APPLICATIONS

This application is a Continuation of U.S. patent application Ser. No. 12/732,775, filed Mar. 26, 2010, which claims the benefit of Japanese Patent Application No. 2009-198701, filed Aug. 28, 2009, both of which are incorporated herein by reference in their entirety.

BACKGROUND OF THE INVENTION

1. Field of the Invention

The present invention relates to a laminated group III nitride semiconductor wafer and a group III nitride semiconductor device.

2. Related Background Art

Literature 1 discloses a high electron mobility transistor (HEMT). In the HEMT disclosed in Literature 1, an AlN layer (50 nm), an $Al_{0.06}Ga_{0.94}N$ layer (100 nm), an $Al_{0.06}Ga_{0.94}N$ layer (450 nm) for a channel layer, and an $Al_{0.31}Ga_{0.69}N$ layer (25 nm) for a barrier layer are laminated in sequence on an SiC substrate. Literature 1 states that a channel layer including AlGaN in the HEMT causes alloy scattering to lower the electron mobility.

Literature 2 discloses a HEMT. In the HEMT disclosed in Literature 2, an AlN buffer layer, an AlGaN channel layer, and an AlGaN barrier layer are laminated in sequence on a sapphire substrate.

Literature 1: Ajay RAMAN et al., Japanese Journal of Applied Physics, Vol. 47, No. 5, pp. 3359-3361 (2008)
Literature 2: Takuma Nanjo et al., Applied Physics Letters, Vol. 92, 263502 (2008)

SUMMARY OF THE INVENTION

The inventors studied the conventional group III nitride semiconductor devices. As a result, the inventors have found the following problems. Electronic devices such as HEMTs including gallium nitride-based semiconductor have currently been considered promising because of their high breakdown field strength and their high mobility in a two-dimensional electron gas channel. Typically, in the electronic devices, a channel layer includes GaN, and a barrier layer for a heterojunction with the channel layer includes AlGaN.

On the other hand, group III nitride-based semiconductor containing Al, such as AlGaN, for example, has a greater bandgap and a higher breakdown field strength than GaN. Therefore, an electronic device having a higher breakdown voltage and a higher output power can be made by using AlGaN for the channel layer. Concerning a structure of the channel layer including Al, a trial to use AlGaN for the channel layer is described in Literatures 1 and 2, for example.

However, it has been thought as follows. The channel layer containing Al cannot have better current characteristics as compared with the GaN channel layer not containing Al, since the mobility of a two-dimensional electron gas becomes lower under the influence of alloy scattering as the Al composition is higher. Literature 1 also states that the mobility is a very low value of less than 200 $cm^2/(Vs)$ when the Al composition in the channel layer is about 30%. This value of the mobility is one-fifth of a typical GaN channel HEMT or less.

For overcoming the problems mentioned above, an object of the present invention is to provide a group III nitride semiconductor device that has a channel layer comprising group III nitride-based semiconductor containing Al and can improve current characteristics by an enhancement of the mobility of the two-dimensional electron gas. Also, an object of the present invention is to provide a group III nitride semiconductor wafer used for making the group III nitride semiconductor device.

In accordance with the present invention, the first group III nitride semiconductor wafer comprises: (1) a substrate comprising $Al_XGa_{1-X}N$ (0<X≤1); (2) a first semiconductor layer comprising group III nitride-based semiconductor, the group III nitride-based semiconductor containing Al, the first semiconductor layer being provided on the substrate; (3) a second semiconductor layer comprising group III nitride-based semiconductor having a bandgap greater than the first semiconductor layer, the second semiconductor layer provided on the first semiconductor layer; and (4) the first semiconductor layer having full width at half maximum (FWHM) values of X-ray rocking curves for (0002) and (10-12) planes of less than 1000 arcseconds.

In accordance with the present invention, the second group III nitride semiconductor wafer comprises: (1) an $Al_XGa_{1-X}N$ (0<X≤1) layer provided on a substrate; (2) a first semiconductor layer comprising group III nitride-based semiconductor, the group III nitride-based semiconductor containing Al, and the first semiconductor layer being provided on the $Al_XGa_{1-X}N$ layer; (3) a second semiconductor layer comprising group III nitride-based semiconductor, the group III nitride-based semiconductor having a bandgap greater than the first semiconductor layer, the second semiconductor layer being provided on the first semiconductor layer; and (4) the first semiconductor layer having full width at half maximum (FWHM) values of X-ray rocking curves for (0002) and (10-12) planes of less than 1000 arcseconds.

In accordance with the present invention, the first group III nitride semiconductor device comprises: (1) a substrate comprising $Al_XGa_{1-X}N$ (0<X≤1); (2) a channel layer comprising group III nitride-based semiconductor, the group III nitride-based semiconductor containing Al, and the channel layer being provided on the substrate; (3) a barrier layer comprising group III nitride-based semiconductor, the group III nitride-based semiconductor having a bandgap greater than the channel layer, the barrier layer being provided on the channel layer; and (4) the channel layer having full width at half maximum (FWHM) values of X-ray rocking curves for (0002) and (10-12) planes of less than 1000 arcseconds.

In accordance with the present invention, the second group III nitride semiconductor device in accordance with the present invention comprises: (1) an $Al_XGa_{1-X}N$ (0<X≤1) layer provided on a substrate; a channel layer comprising group III nitride-based semiconductor, (2) the group III nitride-based semiconductor containing Al, and the channel layer being provided on the $Al_XGa_{1-X}N$ layer; (3) a barrier layer comprising group III nitride-based semiconductor, the group III nitride-based semiconductor having a bandgap greater than the channel layer, the barrier layer being provided on the channel layer; and (4) the channel layer having full width at half maximum (FWHM) values of X-ray rocking curves for (0002) and (10-12) planes of less than 1000 arcseconds.

In general, in a semiconductor device such as a HEMT having a GaN channel layer, no significant correlation is indicated between the mobility of the two-dimensional electron gas and the crystallinity of GaN. Even if a full width at half maximum value of X-ray rocking curve in the GaN channel layer varies widely between two HEMTs, for example, the sheet resistance value in the interface of the channel layer with a barrier layer hardly changes. Therefore, sapphire and SiC substrates are often used as a base substrate for the GaN channel layer.

In this regard, as a result of diligent studies, the inventors have found that the mobility of the two-dimensional electron gas in a channel layer (or a first semiconductor layer) comprising group III nitride-based semiconductor containing Al greatly depends on the crystallinity of the channel layer, so that the mobility is sufficient if the crystallinity is favorable. By forming the channel layer (or the first semiconductor layer) such that the FWHM values of X-ray rocking curves for (0002) and (10-12) planes are very low values of less than 1000 arcseconds, the sheet resistance value in the interface with the barrier layer (or the second semiconductor layer) can reduce, and the mobility of the two-dimensional electron gas can be enhanced.

In each of the above-mentioned first and second group III nitride semiconductor wafers and first and second group III nitride semiconductor devices, the channel layer (or the first semiconductor layer) is formed on the substrate comprising $Al_xGa_{1-x}N$ ($0<X\leq 1$) or the $Al_xGa_{1-x}N$ layer. The channel layer (or the first semiconductor layer) is formed such that the FWHM values of X-ray rocking curves for (0002) and (10-12) planes are less than 1000 arcseconds. This can enhance the mobility of the two-dimensional electron gas and improve current characteristics.

In each of the above-mentioned first and second group III nitride semiconductor wafers, the FWHM values of X-ray rocking curves for (0002) and (10-12) planes of the first semiconductor layer may be less than 400 arcseconds. Similarly, in each of the above-mentioned first and second group III nitride semiconductor devices, the FWHM values of X-ray rocking curves for (0002) and (10-12) planes of the channel layer may be less than 400 arcseconds. Such a better crystallinity of the channel layer (or the first semiconductor layer) can further enhance the mobility of the two-dimensional electron gas and remarkably improve current characteristics.

In each of the above-mentioned first and second group III nitride semiconductor wafers, the first and second semiconductor layers may be made of AlGaN. Similarly, in each of the above-mentioned first and second group III nitride semiconductor devices, the channel and barrier layers may be made of AlGaN. These group III nitride semiconductor devices have a very high breakdown field strength and a high two-dimensional electron gas mobility.

The above object and other objects, features, and advantages of the present invention are more readily apparent from the following detailed description of its preferred embodiments set forth with reference to the accompanying drawings.

As explained above, one aspect of the present invention provides a group III nitride semiconductor device which has a channel layer comprising group III nitride-based semiconductor containing Al. The group III nitride semiconductor device can enhance the mobility of the two-dimensional electron gas and improve current characteristics. Another aspect of the present invention provides a group III nitride semiconductor wafer used for making the group III nitride semiconductor device.

BRIEF DESCRIPTION OF THE DRAWINGS

FIG. 3 is a table listing a kind of substrate, a thickness of an AlN epitaxial layer, the FWHM values of X-ray rocking curves for (0002) and (10-12) planes of the AlN epitaxial layer, the FWHM values of X-ray rocking curves for (0002) and (10-12) planes of an AlGaN channel layer, and sheet resistance value near the interface of the AlGaN channel layer with an AlGaN barrier layer in each of laminated wafers A1 to A6;

FIG. 4 is a table listing a kind of substrate, a thickness of an AlN epitaxial layer, the FWHM values of X-ray rocking curves for (0002) and (10-12) planes of the AlN epitaxial layer, the FWHM values of X-ray rocking curves for (0002) and (10-12) planes of an AlGaN channel layer, and sheet resistance value near the interface of the AlGaN channel layer with an AlGaN barrier layer in each of laminated wafers B1 to B4;

FIG. 7 is a table listing a kind of substrate, thickness of an AlN epitaxial layer, the FWHM values of X-ray rocking curves for (0002) and (10-12) planes of the AlN epitaxial layer, the FWHM values of X-ray rocking curves for (0002) and (10-12) planes of an AlGaN channel layer, and sheet resistance value near the interface of the AlGaN channel layer with an AlGaN barrier layer in each of laminated wafers C1 and C2;

FIG. 8 is a table listing a kind of substrate, thickness of an AlN epitaxial layer, the FWHM values of X-ray rocking curves for (0002) and (10-12) planes of the AlN epitaxial layer, the FWHM values of X-ray rocking curves for (0002) and (10-12) planes of an AlGaN channel layer, and sheet resistance value near the interface of the AlGaN channel layer with an AlGaN barrier layer in a wafer D1;

FIG. 11 is a table listing a kind of substrate, the FWHM values of X-ray rocking curves for (0002) and (10-12) planes of a GaN channel layer, and sheet resistance value near the interface of the GaN channel layer with an AlGaN barrier layer in each of laminated wafers E1 to E3;

DESCRIPTION OF THE PREFERRED EMBODIMENTS

Embodiments of the group III nitride semiconductor wafer and group III nitride semiconductor device in accordance with the present invention will be explained in detail with reference to FIGS. 1 to 13 in the following. The same or equivalent parts will be referred to with the same signs in the explanation of the drawings. In addition, overlapping descriptions will be omitted.

Figure 1:
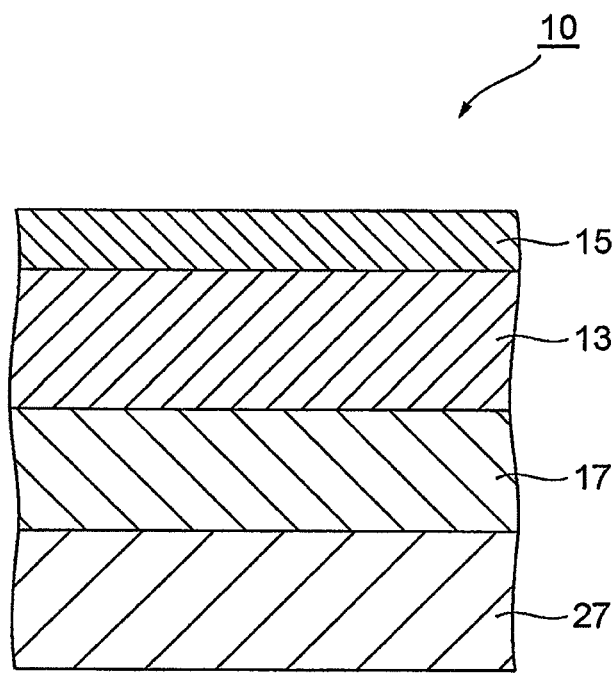
FIG. 1 is a schematic view illustrating the structure of the group III nitride semiconductor wafer in accordance with an embodiment.

FIG. 1 is a schematic view illustrating the structure of the group III nitride semiconductor wafer in accordance with an embodiment. The group III nitride semiconductor wafer 10 comprises a first $Al_{X1}In_{Y1}Ga_{1-X1-Y1}N$ (0<X1≤1, 0≤Y1<1, 0<X1+Y1≤1) layer 13 and a second $Al_{X2}In_{Y2}Ga_{1-X2-Y2}N$ (0≤X2≤1, 0≤Y2≤1, 0<X2+Y2≤1) layer 15. The first $Al_{X1}In_{Y1}Ga_{1-X1-Y1}N$ layer 13 is made of group III nitride semiconductor containing Al. The second $Al_{X2}In_{Y2}Ga_{1-X2-Y2}N$ layer 15 is made of group III nitride semiconductor. The second $Al_{X2}In_{Y2}Ga_{1-X2-Y2}N$ layer 15 is disposed on the first $Al_{X1}In_{Y1}Ga_{1-X1-Y1}N$ layer 13. The second $Al_{X2}In_{Y2}Ga_{1-X2-Y2}N$ layer 15 has a bandgap greater than that of the first $Al_{X1}In_{Y1}Ga_{1-X1-Y1}N$ layer 13 and forms a heterojunction with the first $Al_{X1}In_{Y1}Ga_{1-X1-Y1}N$ layer 13. As will be explained later, the FWHM values of X-ray rocking curves for (0002) and (10-12) planes of the first $Al_{X1}In_{Y1}Ga_{1-X1-Y1}N$ layer 13 is preferably less than 1000 arcsec, more preferably less than 400 arcsec. The lower limit of the FWHM values of X-ray rocking curves are 10 arcsec, for example.

The first $Al_{X1}In_{Y1}Ga_{1-X1-Y1}N$ layer 13 and the second $Al_{X2}In_{Y2}Ga_{1-X2-Y2}N$ layer 15 may be made of AlGaN (i.e., Y1=Y2=0, 0<X1<1, 0<X2<1). The first $Al_{X1}In_{Y1}Ga_{1-X1-Y1}N$ layer 13 and the second $Al_{X2}In_{Y2}Ga_{1-X2-Y2}N$ layers 15 are grown by metalorganic vapor-phase epitaxy, for example.

In a preferred example, the first $Al_{X1}In_{Y1}Ga_{1-X1-Y1}N$ layer 13 has a thickness of 600 nm, an Al atomic composition ratio X1 of 0.3, and an In atomic composition ratio Y1 of 0. In this example, the second $Al_{X2}In_{Y2}Ga_{1-X2-Y2}N$ layer 15 has a thickness of 30 nm, an Al atomic composition ratio X2 of 0.4, and an In atomic composition ratio Y2 of 0.

The first $Al_{X1}In_{Y1}Ga_{1-X1-Y1}N$ layer 13 is disposed on an epitaxial layer 17. The epitaxial layer 17 is made of group III nitride-based semiconductor, an example of that is AlN. The epitaxial layer 17 is disposed on a substrate 27. The thickness suitable for achieving the above-mentioned FWHM values of X-ray rocking curves of the first $Al_{X1}In_{Y1}Ga_{1-X1-Y1}N$ layer 13 depends on the kind of the substrate 27. When the substrate 27 is made of $Al_XGa_{1-X}N$ (0<X≤1), the suitable thickness of the epitaxial layer 17 is 600 nm or greater, for example. When the substrate 27 has a composition different from group III nitrides, such as sapphire or SiC, the suitable thickness of the epitaxial layer 17 is 600 nm, for example, more preferably 900 nm or greater, further preferably 2000 nm or greater. When the substrate 27 is made of $Al_XGa_{1-X}N$ (0<X≤1), the suitable thickness of the substrate 27 is 430 µm, for example. When the substrate 27 contains Al, the epitaxial layer 17 may be omitted, so that the first $Al_{X1}In_{Y1}Ga_{1-X1-Y1}N$ layer 13 is directly grown on the substrate 27.

Figure 2:
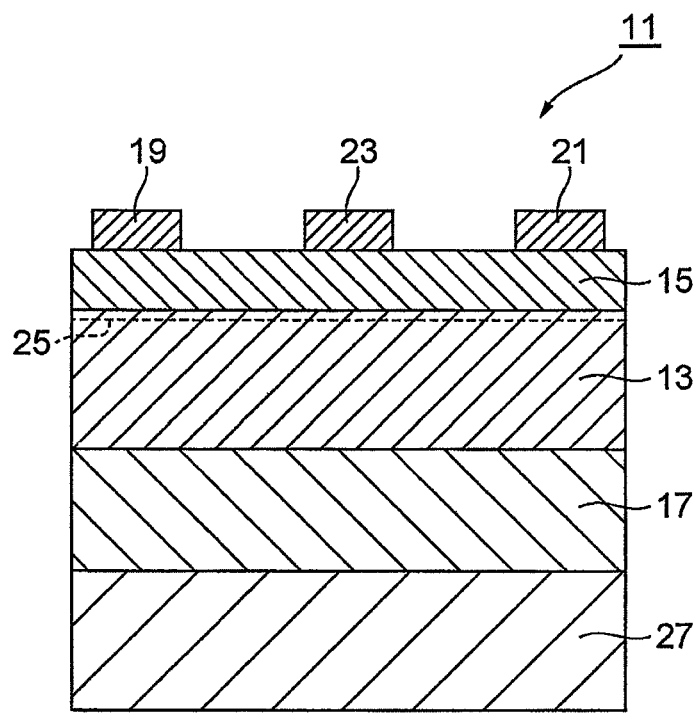
FIG. 2 is a schematic view illustrating the structure of the group III nitride semiconductor device in accordance with an embodiment.

FIG. 2 is a schematic view illustrating the structure of the group III nitride semiconductor device 11 in accordance with an embodiment. The group III nitride semiconductor device 11 is a heterojunction transistor or a Schottky barrier diode, for example. The group III nitride semiconductor device 11 comprises the epitaxial layer 17, the first $Al_{X1}In_{Y1}Ga_{1-X1-Y1}N$ layer 13, and the second $Al_{X2}In_{Y2}Ga_{1-X2-Y2}N$ layer 15 that are laminated in sequence on the substrate 27. These layers are constructed as in the group III nitride semiconductor wafer 10 illustrated in FIG. 1, so that the first $Al_{X1}In_{Y1}Ga_{1-X1-Y1}N$ layer 13 is provided for a channel layer, and the second $Al_{X2}In_{Y2}Ga_{1-X2-Y2}N$ layer 15 is provided for a barrier layer. The group III nitride semiconductor device 11 further comprises electrodes 19 and 21 arranged on the second $Al_{X2}In_{Y2}Ga_{1-X2-Y2}N$ layer 15. The group III nitride semiconductor device 11 further comprises an electrode 23 arranged between the electrodes 19 and 21 on the second $Al_{X2}In_{Y2}Ga_{1-X2-Y2}N$ layer 15.

When the group III nitride semiconductor device 11 is provided for a heterojunction transistor, the electrode 19 is provided for one of source and drain electrodes, the electrode 21 is provided for another of the source and drain electrodes, and the electrode 23 is provided for a gate electrode. When the group III nitride semiconductor device 11 is provided for a Schottky barrier diode, the electrodes 19 and 21 are provided for anode electrodes, and the electrode 23 is provided for a cathode electrode.

A reverse bias is applied to the electrode 23 in a certain period during when the group III nitride semiconductor device 11 operates. On the other hand, a forward bias is applied to the electrode 23 in the other period during when the group III nitride semiconductor device 11 operates. During this operating period, the electrodes 19 and 21 supply carriers flowing through the group III nitride semiconductor device 11. For this reason, the electrodes 19 and 21 are preferably in ohmic contact with the second $Al_{X2}In_{Y2}Ga_{1-X2-Y2}N$ layer 15. The electrode 23 is preferably in Schottky contact with the second $Al_{X2}In_{Y2}Ga_{1-X2-Y2}N$ layer 15. In the group III nitride semiconductor device 11, the heterojunction between the first $Al_{X1}In_{Y1}Ga_{1-X1-Y1}N$ layer 13 and the second $Al_{X2}In_{Y2}Ga_{1-X2-Y2}N$ layer 15 produces a two-dimensional electron gas layer 25 within the first $Al_{X1}In_{Y1}Ga_{1-X1-Y1}N$ layer 13.

Advantages of the group III nitride semiconductor wafer 10 and group III nitride semiconductor device 11 in accordance with these embodiments will now be explained. As mentioned above, electronic devices such as HEMTs including gallium nitride-based semiconductor have currently been considered promising because of their high breakdown field strength and their high mobility in a two-dimensional electron gas channel. Such an electronic device often has a GaN channel layer. In a semiconductor device having a GaN channel layer, there are no significant correlation between the mobility of the two-dimensional electron gas and the crystallinity of GaN in general. Therefore, sapphire and SiC substrates are often used as a base substrate for the GaN channel layer.

On the other hand, group III nitride-based semiconductor containing Al has a greater bandgap and a higher breakdown field strength than those of GaN. Whereby, using group III nitride-based semiconductor containing Al in the channel layer can make an electronic device having a higher breakdown voltage and higher output. However, it has conventionally been considered as follows. The channel layer containing Al cannot have better current characteristics as compared with the GaN channel layer containing no Al, since the mobility of a two-dimensional electron gas becomes lower under the influence of alloy scattering as the Al composition is higher.

In contrast, by experiments which will be explained later, the inventors have found that the mobility of the two-dimensional electron gas in the first $Al_{X1}In_{Y1}Ga_{1-X1-Y1}N$ layer 13 (channel layer) in the embodiments greatly depends on the crystallinity of this layer, so that the mobility is sufficient if the crystallinity is favorable. By forming the first $Al_{X1}In_{Y1}Ga_{1-X1-Y1}N$ layer 13 such that the FWHM values of X-ray rocking curves for (0002) and (10-12) planes are very low values of less than 1000 arcseconds, more preferably less than 400 arcseconds, the sheet resistance value in the interface with the second $Al_{x2}In_{y2}Ga_{1-x2-y2}N$ layer 15 can reduce, and the mobility of the two-dimensional electron gas can be enhanced. This can also improve current characteristics.

The above-explained relationship between the FWHM values of X-ray rocking curves of the first $Al_{x1}In_{y1}Ga_{1-x1-y1}N$ layer 13 and the mobility of the two-dimensional electron gas has been found by the inventors according to the following experiments. In general, the FWHM value of an X-ray rocking curve is used for evaluating the crystallinity of a nitride semiconductor. In this case, the FWHM values of X-ray rocking curves for (0002) and (10-12) planes are used as symmetrical and asymmetrical surfaces, respectively. That is, when a nitride semiconductor crystal is assumed to be an assembly of a plurality of crystalline masses, the FWHM value of X-ray rocking curve for (0002) plane indicates fluctuations in the forward, backward, leftward, and rightward directions of the c-axis of each crystalline mass, while the FWHM value of X-ray rocking curve for (10-12) plane indicates fluctuations in rotations about the c-axis. Therefore the crystallinity can be said to become better as these values of X-ray rocking curves are smaller. In the following experiments, a slit used for measuring X-ray rocking curves is 2.0 mm in length and 0.5 mm in width. Though the FWHM values of X-ray rocking curves for (0004) plane, (20-24) plane and the like may differ from the values for (0002) and (10-12) planes, physically the same characteristics are evaluated. Therefore the tendencies of the values for (0004) plane, (20-24) plane and the like are similar to those of the values for (0002) and (10-12) planes.

Experimental Examples

Experiment 1: Six sapphire substrates were prepared, and the following semiconductor layers were grown thereon by metalorganic vapor-phase epitaxy (MOVPE), so as to make six laminated wafers A1 to A6. First, the substrates were heat-treated for 5 min in a furnace in a hydrogen atmosphere at 1050 degrees under an in-furnace pressure of 50 Torr (where 1 Torr is equivalent to 133.322 Pa). Thereafter, AlN epitaxial layers were grown under conditions with a temperature of 1250 degrees, an in-furnace pressure of 50 Torr, and a V/III ratio of 13. Here, the respective AlN epitaxial layers on the five sapphire substrates had thicknesses of 80 nm, 140 nm, 200 nm, 900 nm, and 600 nm. Subsequently, under conditions with a temperature of 1100 degrees, an in-furnace pressure of 80 Torr, and a V/III ratio of 4300, an AlGaN channel layer having a thickness of 600 nm was grown on each AlN epitaxial layer. The AlGaN channel layer had an Al atomic composition ratio of 0.3 and a Ga atomic composition ratio of 0.7. Then, under conditions with a temperature of 1100 degrees, an in-furnace pressure of 80 Torr, and a V/III ratio of 2100, an AlGaN barrier layer having a thickness of 30 nm was grown on each AlGaN channel layer. The AlGaN barrier layer had an Al atomic composition ratio of 0.4 and a Ga atomic composition ratio of 0.6.

Separately from the above, four sapphire substrates were prepared. An AlN epitaxial layer, an AlGaN channel layer, and an AlGaN barrier layer were grown in sequence on each of the sapphire substrates by MOVPE, so as to make four laminated wafers B1 to B4. The AlGaN channel layer had an Al composition of 30%. The AlGaN barrier layer had an Al atomic composition ratio of 0.5 and a Ga atomic composition ratio of 0.5. Except for the AlGaN barrier layer, the layers were grown as in Experiment 1 in terms of the method and growing conditions, such that the respective AlN epitaxial layers on the four sapphire substrates had thicknesses of 80 nm, 150 nm, 900 nm, and 600 nm.

Figure 5:
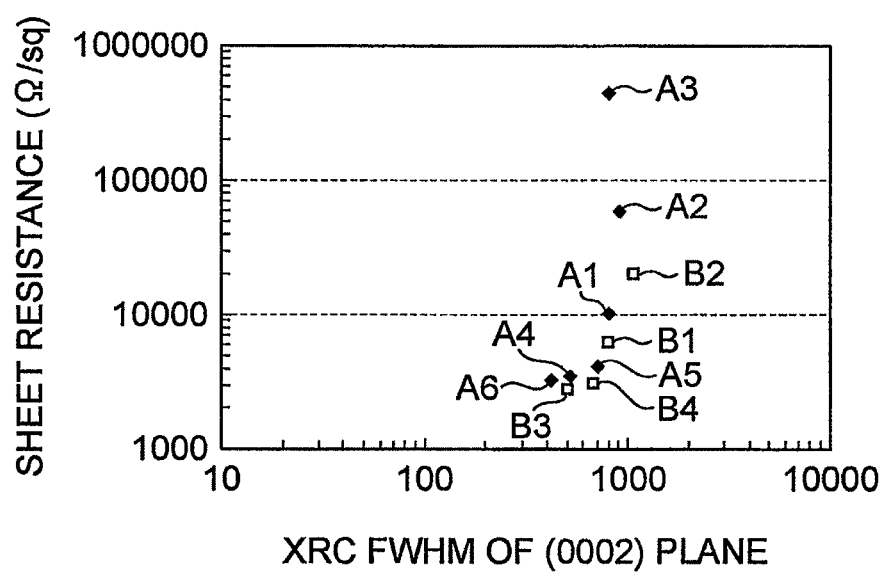
FIG. 5 is a graph showing the correlation between the FWHM value of X-ray rocking curve for (0002) plane of the AlGaN channel layer and the sheet resistance value in each of the laminated wafers A1 to A6 and B1 to B4.
Figure 6:
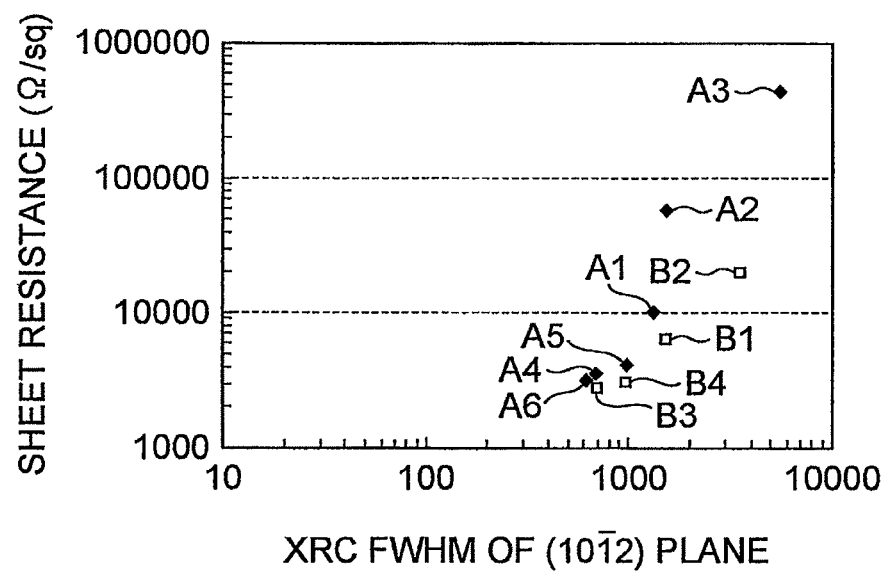
FIG. 6 is a graph showing the correlation between the FWHM value of X-ray rocking curve for (10-12) plane of the AlGaN channel layer and the sheet resistance value in each of the laminated wafers A1 to A6 and B1 to B4.

FIG. 3 and FIG. 4 are tables listing the kind of substrate, thickness of an AlN epitaxial layer, the FWHM values of X-ray rocking curves for (0002) and (10-12) planes of the AlN epitaxial layer, the FWHM values of X-ray rocking curves for (0002) and (10-12) planes of the AlGaN channel layer, and sheet resistance value near the interface of the AlGaN channel layer with the AlGaN barrier layer in each of the laminated wafers A1 to A6 and B1 to B4. FIG. 5 is a graph showing the correlation between the FWHM value of X-ray rocking curve for (0002) plane of the AlGaN channel layer and the sheet resistance value in each of the laminated wafers A1 to A6 and B1 to B4. FIG. 6 is a graph showing the correlation between the FWHM value of X-ray rocking curve for (10-12) plane of the AlGaN channel layer and the sheet resistance value in each of the laminated wafers A1 to A6 and B1 to B4.

As shown in FIG. 3, when the AlN epitaxial layer has a thickness of 600 nm or greater (laminated wafers A4 to A6), the FWHM values of X-ray rocking curves for (0002) and (10-12) planes of the AlGaN channel layer are less than 1000 arcsec. Therefore it is understood that crystallinities of laminated wafers A4 to A6 are favorable. In this case, as shown in FIG. 5 and FIG. 6, the sheet resistance values in the laminated wafers A4 to A6 are much lower than those in the other laminated wafers A1 to A3, which means that the conductivity caused by the mobility of the two-dimensional electron gas and the like in the laminated wafers A4 to A6 is higher than that in the others.

Even in the case where the AlGaN channel layer has a relatively large Al composition, as shown in FIG. 4, when the AlN epitaxial layer has a thickness of 600 nm or greater (laminated wafers B3 and B4), each of the FWHM values of X-ray rocking curves for (0002) and (10-12) planes of the AlGaN channel layer is less than 1000 arcsec. Therefore it is understood that crystallinities of the laminated wafers B3 and B4 are favorable. In this case, as shown in FIG. 5 and FIG. 6, the sheet resistance values in the laminated wafers B3 and B4 are much lower than those in the other laminated wafers B1 and B2, which means that the conductivity caused by the mobility of the two-dimensional electron gas and the like in the laminated wafers B3 and B4 is higher than that in the others.

That is, even in an AlGaN channel layer on a sapphire substrate, when the FWHM values of X-ray rocking curves for (0002) and (10-12) planes are less than 1000 arcseconds, its sheet resistance is suppressed to about twice that in a laminated wafer D1 having a very low sheet resistance, and thus the AlGaN channel layer is sufficiently practical.

Also, clearly from FIGS. 5 and 6, even when the difference between the Al atomic composition ratio of the AlGaN barrier layer and the Al atomic composition ratio of the AlGaN channel layer is small, i.e., about 0.1 (10%), or large, i.e., about 0.2 (20%), the sheet resistance value of the AlGaN channel layer near the interface with the AlGaN barrier layer becomes lower as the FWHM value of X-ray rocking curve of the AlGaN channel layer is smaller. Hence, regardless of the Al composition in the AlGaN barrier layer and AlGaN channel layer, the conductivity caused by the mobility of two-dimensional electron gas and the like becomes higher as the crystallinity of the AlGaN channel layer is better.

Experiment 2: Two AlN substrates were prepared, and the following semiconductor layers were grown thereon by metalorganic vapor-phase epitaxy (MOVPE), so as to make laminated wafers C1 and C2. First, under conditions with a temperature of 1250 degrees, an in-furnace pressure of 50 Torr, and a V/III ratio of 13, an AlN epitaxial layer was grown by 800 nm on each AlN substrate. Subsequently, under conditions with a temperature of 1100 degrees, an in-furnace pressure of 80 Torr, and a V/III ratio of 4300, an AlGaN channel layer having a thickness of 600 nm was grown on each AlN epitaxial layer. The AlGaN channel layer had an Al atomic composition ratio of 0.3 and a Ga atomic composition ratio of 0.7. Then, under conditions with a temperature of 1100 degrees, an in-furnace pressure of 80 Torr, and a V/III ratio of 2100, an AlGaN barrier layer having a thickness of 30 nm was grown on each AlGaN channel layer. The AlGaN barrier layer had an Al atomic composition ratio of 0.4 and a Ga atomic composition ratio of 0.6. The FWHM value of X-ray rocking curve for substrate slightly varies between the laminated wafers C1 and C2, though they have the same epitaxial structure.

Separately from the above, an AlGaN substrate was prepared, and the following semiconductor layers were grown on the AlGaN substrate by metalorganic vapor-phase epitaxy (MOVPE), so as to make a laminated wafer D1. The AlGaN substrate had an Al composition of 30%. First, under conditions with a temperature of 1100 degrees, an in-furnace pressure of 80 Torr, and a V/III ratio of 4300, an AlGaN channel layer having a thickness of 600 nm was grown on the substrate. The AlGaN channel layer had an Al atomic composition ratio of 0.3 and a Ga atomic composition ratio of 0.7. Subsequently, under conditions with a temperature of 1100 degrees, an in-furnace pressure of 80 Torr, and a V/III ratio of 2100, an AlGaN barrier layer having a thickness of 30 nm was grown on the AlGaN channel layer. The AlGaN barrier layer had an Al atomic composition ratio of 0.4 and a Ga atomic composition ratio of 0.6.

Figure 9:
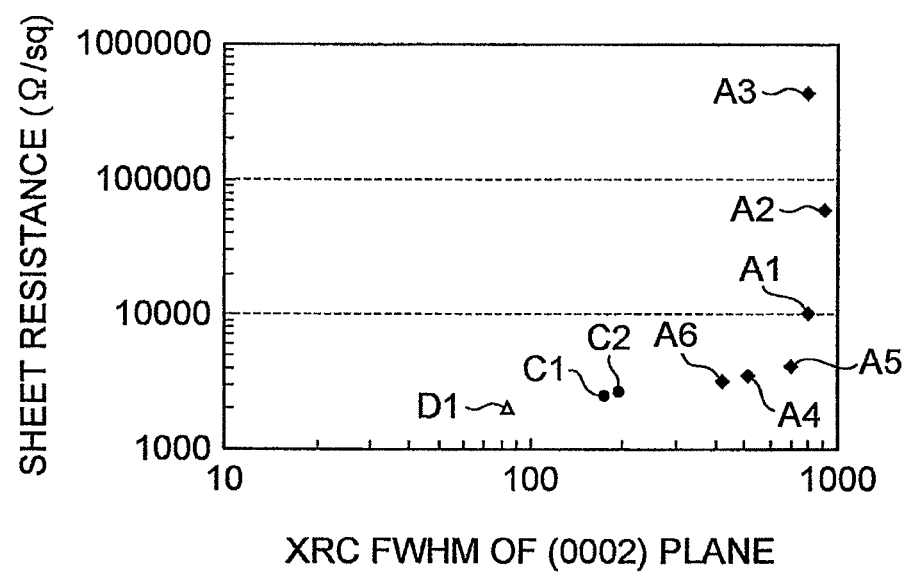
FIG. 9 is a graph showing the correlation between the FWHM value of X-ray rocking curve for (0002) plane of the AlGaN channel layer and the sheet resistance value in each of the laminated wafers C1, C2, and D1 as well as the laminated wafers A1 to A6.
Figure 10:
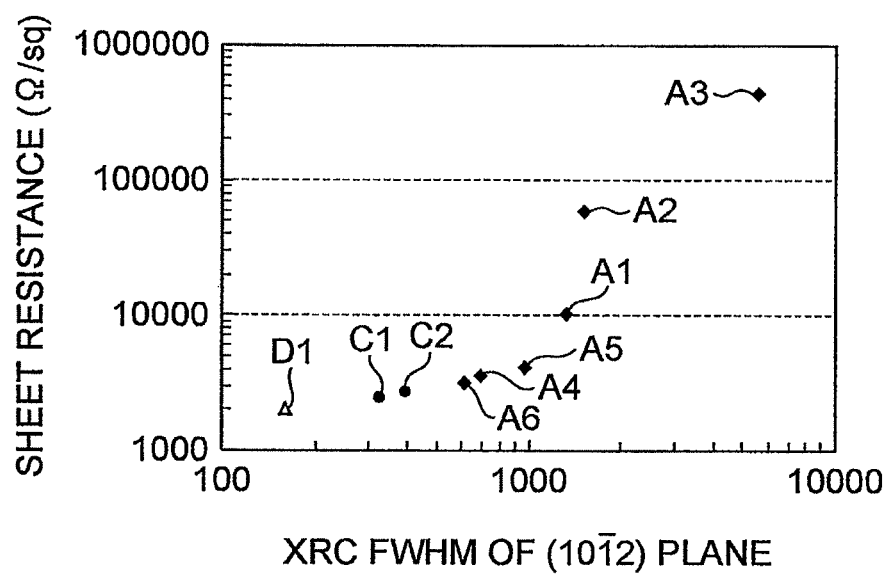
FIG. 10 is a graph showing the correlation between the FWHM value of X-ray rocking curve for (10-12) plane of the AlGaN channel layer and the sheet resistance value in each of the laminated wafers C1, C2, and D1 as well as the laminated wafers A1 to A6.

FIGS. 7 and 8 are tables listing the kind of substrate, thickness of an AlN epitaxial layer, the FWHM values of X-ray rocking curves for (0002) and (10-12) planes of the AlN epitaxial layer, the FWHM values of X-ray rocking curves for (0002) and (10-12) planes of the AlGaN channel layer, and sheet resistance value near the interface of the AlGaN channel layer with the AlGaN barrier layer in each of the laminated wafers C1, C2, and D1. FIG. 9 is a graph showing the correlation between the FWHM value of X-ray rocking curve for (0002) plane of the AlGaN channel layer and the sheet resistance value in each of the laminated wafers C1, C2, and D1 as well as the laminated wafers A1 to A6. FIG. 10 is a graph showing the correlation between the FWHM value of X-ray rocking curve for (10-12) plane of the AlGaN channel layer and the sheet resistance value in each of the laminated wafers C1, C2, and D1 as well as the laminated wafers A1 to A6.

As shown in FIG. 7, the FWHM values of X-ray rocking curves for (0002) and (10-12) planes of the AlGaN channel layer are less than 400 arcseconds in the laminated wafers C1 and C2 using the AlN substrate. Therefore it is understood that crystallinities of the laminated wafers C1 and C2 are more favorable than those in the above-mentioned Experiment 1. In this case, as shown in FIGS. 9 and 10, the sheet resistance values in the laminated wafers C1 and C2 are lower than those in Experiment 1, which means that the conductivity caused by the mobility of the two-dimensional electron gas and the like is much higher.

As shown in FIG. 8, the FWHM values of X-ray rocking curves for (0002) and (10-12) planes of the AlGaN channel layer is much smaller than 400 arcseconds in the wafer D1 using the AlGaN substrate. Therefore it is understood that a crystallinity of the laminated wafer D1 is more favorable than that of the wafer C1 using the AlN substrate. In this case, as shown in FIG. 9 and FIG. 10, the sheet resistance value in the laminated wafer D1 is lower than those in the laminated wafers C1 and C2, which means that the conductivity caused by the mobility of the two-dimensional electron gas and the like is very high.

From the above-mentioned, the FWHM values of X-ray rocking curves for (0002) and (10-12) planes of the AlGaN channel layer are preferably less than 400 arcseconds. This is because the laminated wafers C1 and C2 made by using the AlN substrates having a favorable crystallinity has the FWHM values of less than 400 arcsec, thereby greatly lowering the sheet resistance values as compared with the laminated wafers A1 to A6 using the sapphire substrates.

In each of the above-mentioned Experiments 1 and 2, particularly the sheet resistance value of the AlGaN channel layer correlates highly with the FWHM value of X-ray rocking curve for (10-12) plane, i.e., r-plane, of the AlGaN channel layer. Though the AlGaN layer is formed as an example of the channel layer in each of Experiments 1 and 2, channel layers made of group III nitride-based semiconductors containing Al, such as InAlN and InAlGaN, seem to have tendencies similar to the results of each of the experiments. A structure in which an AlN layer is disposed between an AlGaN channel layer and an AlGaN barrier layer is also seemed to have a tendency similar to the results of each of the above-mentioned experiments.

Experiment 3: A cross-section of each of the laminated wafer A4 in Experiment 1 and the laminated wafer C1 in Experiment 2 was observed through a transmission electron microscope (TEM), so as to measure the dislocation density of the AlGaN channel layer. As a result, the dislocation density of the AlGaN channel layer in the wafer C1 (using the AlN substrate) was $5 \times 10^9$ cm$^2$, and the dislocation density of the AlGaN channel layer in the wafer A4 (using the sapphire substrate) was $9 \times 10^9$ cm$^2$. Thus, when the FWHM value of X-ray rocking curve is sufficiently small even if the dislocation density is relatively high, the current characteristics can be improved by a high mobility of two-dimensional electron gas.

Experiment 4: As a comparative example of this embodiment, laminated wafers having a GaN channel layer containing no Al were made. That is, two sapphire substrates and a Si substrate were prepared, and the following semiconductor layers were grown on these substrates by metalorganic vapor-phase epitaxy (MOVPE), so as to make three laminated wafers E1 to E3.

Specifically, on each of the two sapphire substrates, a GaN channel layer having a thickness of 2 μm was grown, and an AlGaN barrier layer having a thickness of 25 nm was further grown thereon. The AlGaN barrier layer had an Al atomic composition ratio of 0.25 and a Ga atomic composition ratio of 0.75. At that time, different initial growth conditions (temperature, heating rate, and the like) between the two sapphire substrates were set, so that their GaN channel layers have crystallinities different from each other. As a result, laminated wafers E1 and E2 were made. On the other hand, an AlN epitaxial layer, a GaN multilayer film, and an AlN layer were grown on a Si substrate, a GaN channel layer having a thickness of 2 μm was grown thereon, and an AlGaN barrier layer having a thickness of 25 nm was further grown thereon. The AlGaN barrier layer had an Al atomic composition ratio of 0.25 and a Ga atomic composition ratio of 0.75. As a result, laminated wafer E3 was made.

Figure 12:
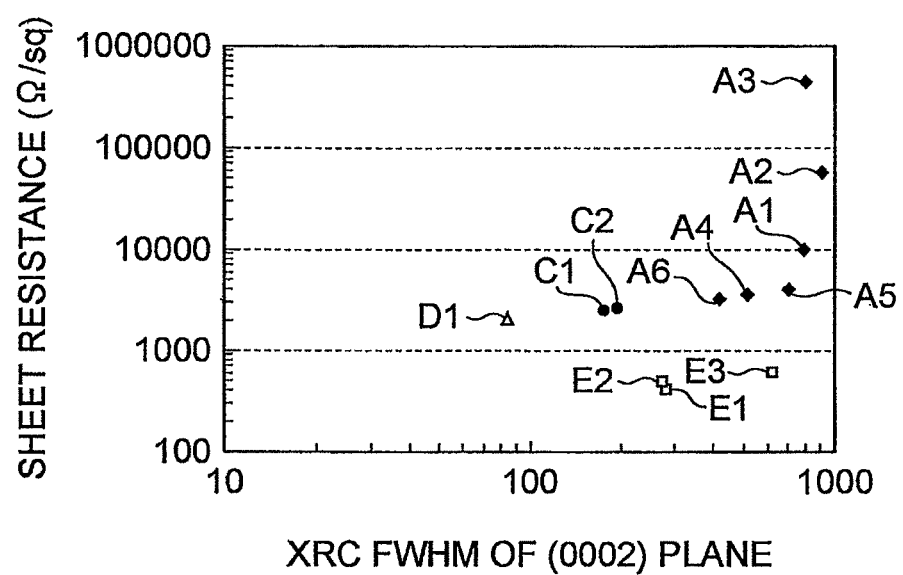
FIG. 12 is a graph showing the correlation between the FWHM value of X-ray rocking curve for (0002) plane of the GaN channel layer and the sheet resistance value in each of the laminated wafers E1 to E3 as well as the laminated wafers A1 to A6, C1, C2, and D1.
Figure 13:
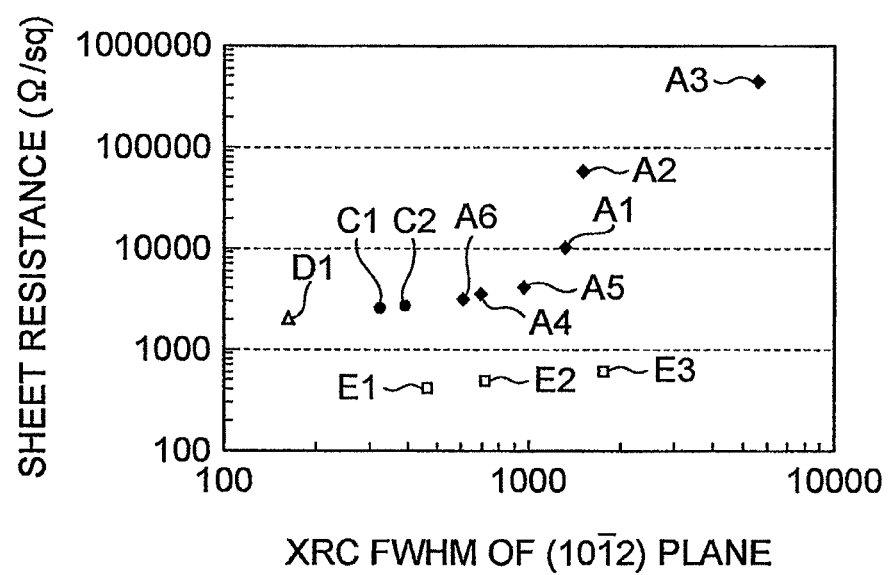
FIG. 13 is a graph showing the correlation between the FWHM value of X-ray rocking curve for (10-12) plane of the GaN channel layer and the sheet resistance value in each of the laminated wafers E1 to E3 as well as the laminated wafers A1 to A6, C1, C2, and D1.

FIG. 11 is a table listing the kind of substrate, the FWHM values of X-ray rocking curves for (0002) and (10-12) planes of the GaN channel layer, and sheet resistance value near the interface of the GaN channel layer with the AlGaN barrier layer in each of the laminated wafers E1 to E3. FIG. 12 is a graph showing the correlation between the FWHM value of X-ray rocking curve for (0002) plane of the GaN channel layer and the sheet resistance value in each of the laminated wafers E1 to E3 as well as the laminated wafers A1 to A6, C1, C2, and D1. FIG. 13 is a graph showing the correlation between the FWHM value of X-ray rocking curve for (10-12) plane of the GaN channel layer and the sheet resistance value in each of the laminated wafers E1 to E3 as well as the laminated wafers A1 to A6, C1, C2, and D1.

As shown in FIGS. 11 to 13, even when a channel layer is made of GaN, the sheet resistance value and the FWHM value of X-ray rocking curve correlate with each other, though the correlation is extremely poor than in Experiments 1 and 2 in which the channel layers are made of AlGaN. Thus, there is no significant correlation between the mobility of the two-dimensional electron gas and the crystallinity of GaN in semiconductor devices having a GaN channel layer. Therefore, no attention has been paid to the crystallinity of channel layers. However, in the channel layers containing Al, a remarkable correlation between the crystallinity of the channel layers and their sheet resistance value (i.e., the mobility of the two-dimensional electron gas) has found in the foregoing experiments. Accordingly, when the FWHM value of X-ray rocking curve is less than 1000 arcsec (more preferably less than 400 arcsec), the conductivity caused by the mobility of the two-dimensional electron gas and the like is remarkably improved.

Though AlGaN is used as a material for the channel layer (or first semiconductor layer) as an example in these embodiments, any group III nitride semiconductors containing Al such as InAlGaN, AlN, and InAlN can be favorably used for the channel layer in accordance with the present embodiments.

While the principle of the present invention has been illustrated and described above in the preferred embodiments of the invention, it will be appreciated by those skilled in the art that the present invention may be varied in arrangement and detail without departing from the principle. The present invention is not limited to the specific structures disclosed in the embodiments. Therefore, all the modifications and alterations within the scope of the claims or the spirit of the invention are to be construed as being covered by the claims.

What is claimed is:

1. A group III nitride semiconductor wafer comprising:
a substrate comprising $Al_xGa_{1-x}N$ (0<x≤1);
a first semiconductor layer comprising group III nitride-based semiconductor, the group III nitride-based semiconductor containing Al, and the first semiconductor layer being provided on the substrate;
a second semiconductor layer comprising group III nitride-based semiconductor having a bandgap greater than the first semiconductor layer, the second semiconductor layer being provided on the first semiconductor layer; and
the first semiconductor layer having full width at half maximum values of X-ray rocking curves for (0002) plane of less than 1000 arcseconds.

2. The group III nitride semiconductor wafer according to claim 1, wherein the full width at half maximum values of X-ray rocking curves for (0002) plane of the first semiconductor layer are less than 400 arcseconds.

3. The group III nitride semiconductor wafer according to claim 1, wherein the first semiconductor layer and the second semiconductor layer comprise AlGaN.

4. A group III nitride semiconductor wafer comprising:
an $Al_xGa_{1-x}N$ (0<x≤1) layer provided on a substrate;
a first semiconductor layer comprising group III nitride-based semiconductor, the group III nitride-based semiconductor containing Al, and the first semiconductor layer being provided on the $Al_xGa_{1-x}N$ layer;
a second semiconductor layer comprising group III nitride-based semiconductor, the group III nitride-based semiconductor having a bandgap greater than the first semiconductor layer, the second semiconductor layer being provided on the first semiconductor layer; and
the first semiconductor layer having full width at half maximum values of X-ray rocking curves for (0002) plane of less than 1000 arcseconds.

5. The group III nitride semiconductor wafer according to claim 4, wherein the full width at half maximum values of X-ray rocking curves for (0002) plane of the first semiconductor layer are less than 400 arcseconds.

6. The group III nitride semiconductor wafer according to claim 4, wherein the first semiconductor layer and the second semiconductor layer comprise AlGaN.

7. A group III nitride semiconductor device comprising:
a substrate comprising $Al_xGa_{1-x}N$ (0<x≤1);
a channel layer comprising group III nitride-based semiconductor, the group III nitride-based semiconductor containing Al, and the channel layer being provided on the substrate;
a barrier layer comprising group III nitride-based semiconductor, the group III nitride-based semiconductor having a bandgap greater than the channel layer, the barrier layer being provided on the channel layer; and
The channel layer having full width at half maximum values of X-ray rocking curves for (0002) plane of less than 1000 arcseconds.

8. The group III nitride semiconductor device according to claim 7, wherein the full width at half maximum values of X-ray rocking curves for (0002) plane of the channel layer are less than 400 arcseconds.

9. The group III nitride semiconductor device according to claim 7, wherein the channel layer and the barrier layer comprise AlGaN.

10. A group III nitride semiconductor device comprising:
an $Al_xGa_{1-x}N$ (0<x≤1) layer provided on a substrate;
a channel layer comprising group III nitride-based semiconductor, the group III nitride-based semiconductor containing Al, and the channel layer being provided on the $Al_xGa_{1-x}N$ layer;
a barrier layer comprising group III nitride-based semiconductor, the group III nitride-based semiconductor having a bandgap greater than the channel layer, the barrier layer being provided on the channel layer; and
The channel layer having full width at half maximum values of X-ray rocking curves for (0002) plane of less than 1000 arcseconds.

11. The group III nitride semiconductor device according to claim 10, wherein the full width at half maximum values of X-ray rocking curves for (0002) plane of the channel layer are less than 400 arcseconds.

12. The group III nitride semiconductor device according to claim 10, wherein the channel layer and the barrier layer comprise AlGaN.

13. A group III nitride semiconductor wafer comprising:
a substrate comprising $Al_xGa_{1-x}N$ (0<x≤1);
a first semiconductor layer comprising group III nitride-based semiconductor, the group III nitride-based semiconductor containing Al, and the first semiconductor layer being provided on the substrate;

a second semiconductor layer comprising group III nitride-based semiconductor having a bandgap greater than the first semiconductor layer, the second semiconductor layer being provided on the first semiconductor layer; and the first semiconductor layer having full width at half maximum values of X-ray rocking curves for (10-12) plane of less than 1000 arcseconds.

14. The group III nitride semiconductor wafer according to claim 13, wherein the full width at half maximum values of X-ray rocking curves for (10-12) plane of the first semiconductor layer are less than 400 arcseconds.

15. The group III nitride semiconductor wafer according to claim 13, wherein the first semiconductor layer and the second semiconductor layer comprise AlGaN.

16. A group III nitride semiconductor wafer comprising:
an $Al_xGa_{1-x}N$ ($0<x\leq1$) layer provided on a substrate;
a first semiconductor layer comprising group III nitride-based semiconductor, the group III nitride-based semiconductor containing Al, and the first semiconductor layer being provided on the $Al_xGa_{1-x}N$ layer;
a second semiconductor layer comprising group III nitride-based semiconductor, the group III nitride-based semiconductor having a bandgap greater than the first semiconductor layer, the second semiconductor layer being provided on the first semiconductor layer; and
the first semiconductor layer having full width at half maximum values of X-ray rocking curves for (10-12) plane of less than 1000 arcseconds.

17. The group III nitride semiconductor wafer according to claim 16, wherein the full width at half maximum values of X-ray rocking curves for (10-12) plane of the first semiconductor layer are less than 400 arcseconds.

18. The group III nitride semiconductor wafer according to claim 16, wherein the first semiconductor layer and the second semiconductor layer comprise AlGaN.

19. A group III nitride semiconductor device comprising:
a substrate comprising $Al_xGa_{1-x}N$ ($0<x\leq1$);
a channel layer comprising group III nitride-based semiconductor, the group III nitride-based semiconductor containing Al, and the channel layer being provided on the substrate;
a barrier layer comprising group III nitride-based semiconductor, the group III nitride-based semiconductor having a bandgap greater than the channel layer, the barrier layer being provided on the channel layer; and
The channel layer having full width at half maximum values of X-ray rocking curves for (10-12) plane of less than 1000 arcseconds.

20. The group III nitride semiconductor device according to claim 19, wherein the full width at half maximum values of X-ray rocking curves for (10-12) plane of the channel layer are less than 400 arcseconds.

21. The group III nitride semiconductor device according to claim 19, wherein the channel layer and the barrier layer comprise AlGaN.

22. A group III nitride semiconductor device comprising:
an $Al_xGa_{1-x}N$ ($0<x\leq1$) layer provided on a substrate;
a channel layer comprising group III nitride-based semiconductor, the group III nitride-based semiconductor containing Al, and the channel layer being provided on the $Al_xGa_{1-x}N$ layer;
a barrier layer comprising group III nitride-based semiconductor, the group III nitride-based semiconductor having a bandgap greater than the channel layer, the barrier layer being provided on the channel layer; and
The channel layer having full width at half maximum values of X-ray rocking curves for (10-12) plane of less than 1000 arcseconds.

23. The group III nitride semiconductor device according to claim 22, wherein the full width at half maximum values of X-ray rocking curves for (10-12) plane of the channel layer are less than 400 arcseconds.

24. The group III nitride semiconductor device according to claim 22, wherein the channel layer and the barrier layer comprise AlGaN.

* * * * *